United States Patent
Souchkov et al.

(10) Patent No.: US 9,019,251 B2
(45) Date of Patent: Apr. 28, 2015

(54) LIGHT SENSOR ARRANGEMENT

(75) Inventors: Vitali Souchkov, Walnut Creek, CA (US); Rob Van Dalen, Bergeijk (NL)

(73) Assignee: NXP, B.V., Eindhoven (NL)

( * ) Notice: Subject to any disclaimer, the term of this patent is extended or adjusted under 35 U.S.C. 154(b) by 896 days.

(21) Appl. No.: 12/670,517

(22) PCT Filed: Jul. 30, 2008

(86) PCT No.: PCT/IB2008/053069
§ 371 (c)(1),
(2), (4) Date: Jan. 29, 2010

(87) PCT Pub. No.: WO2009/016600
PCT Pub. Date: Feb. 5, 2009

(65) Prior Publication Data

US 2010/0225628 A1   Sep. 9, 2010

Related U.S. Application Data

(60) Provisional application No. 60/952,855, filed on Jul. 30, 2007.

(51) Int. Cl.
| | |
|---|---|
| G09G 5/00 | (2006.01) |
| G06F 3/038 | (2013.01) |
| H01L 27/146 | (2006.01) |
| G01J 1/42 | (2006.01) |
| G01J 5/60 | (2006.01) |

(52) U.S. Cl.
CPC ......... *H01L 27/14647* (2013.01); *G01J 1/4204* (2013.01); *G01J 1/4228* (2013.01); *G01J 5/60* (2013.01)

(58) Field of Classification Search
CPC .......... G01J 1/4204; G01J 1/4228; G01J 5/60
USPC ........... 356/213, 222, 224, 212; 345/204, 207
See application file for complete search history.

(56) References Cited

U.S. PATENT DOCUMENTS

| | | | |
|---|---|---|---|
| 4,238,760 A | 12/1980 | Carr | |
| 5,193,900 A * | 3/1993 | Yano et al. | 362/284 |
| 5,666,574 A | 9/1997 | Ogawa | |
| 6,379,979 B1 * | 4/2002 | Connolly | 438/7 |
| 6,632,701 B2 | 10/2003 | Merrill | |
| 6,747,694 B1 * | 6/2004 | Nishikawa et al. | 348/229.1 |
| 6,787,757 B2 | 9/2004 | Comeau | |
| 7,110,028 B1 | 9/2006 | Merrill | |
| 7,964,925 B2 * | 6/2011 | Fattal et al. | 257/431 |
| 8,120,079 B2 * | 2/2012 | Augusto | 257/292 |
| 2002/0162950 A1 | 11/2002 | Comeau | |
| 2006/0007107 A1 * | 1/2006 | Ferguson | 345/102 |

* cited by examiner

*Primary Examiner* — William Boddie
*Assistant Examiner* — Alecia D English

(57) ABSTRACT

Ambient light is sensed for use in determining luminous flux. According to an example embodiment, ambient light is sensed using two light sensor arrangements that respectively respond differently to light of different relative wavelengths. The output of the sensors is nonlinearly combined to generate data indicative of the luminous flux. This luminous flux data is used to generate a control output for controlling an electronic display.

17 Claims, 4 Drawing Sheets

LIGHT SENSOR ARRANGEMENT

This patent document relates to light sensors, and more particularly, to light sensors for detecting luminous light intensity.

Human perception of the image quality of electronic displays is strongly affected by the amount of visible background illumination present in the environment in which the electronic display is located. For instance, when ambient light conditions involve high background illumination (e.g., sunlight or bright artificial light), electronic displays are generally better viewed when operated with high light intensity. When ambient light conditions involve relatively low background illumination (e.g., low-light conditions in the evening or indoors), electronic displays are generally better viewed when operated with low light intensity. In this regard, it is often desirable to control electronic display equipment to provide desirable image quality. These background illumination considerations are applicable to a variety of devices such as portable computers, cell phones, video players, stationary display equipment and others.

Generally, the human eye is sensitive to light having wavelengths of between about 400 nm and 700 nm; this wavelength interval (i.e., the visible spectrum) covers only small fraction of emission spectra for many light sources. Luminous flux is a measure of light that accounts for the sensitivity of the eye by weighting the power at each wavelength with the luminosity function, which represents the eye's response to different wavelengths. Radiant flux is a measure of the total power of emitted radiation, and the ratio of the total luminous flux to the radiant flux is called the luminous efficacy.

Many light sources such as incandescent lights exhibit a relatively low color temperature (temperature of black body radiator) and produce a significant amount of infrared radiation. In this regard, ambient light sensors often are exposed to a significant amount of radiation in addition to radiation in the visible spectrum. If this additional radiation is not accounted for when using such a sensor to detect light that affects human perception, the response of the light sensor can be an inaccurate measure of visible light. For example, semiconductor photo-detectors (including those made of Silicon) feature a substantial sensitivity beyond the visible spectrum in the infrared region, and are thus responsive not only to visible light but to infrared light. The mismatch between the photodiode and eye response presents challenges to accurately extracting the luminous content of radiation.

Addressing the aforesaid difficulties in accurately sensing visible light has been challenging. Manufacturing costs, size limitations, packaging difficulties, process integration and other issues relating to various approaches have been a source of difficulty in effectively and efficiently detecting visible light for controlling electronic displays.

The present invention is directed to overcoming the above-mentioned challenges and others related to the types of applications discussed above and in other applications. These and other aspects of the present invention are exemplified in a number of illustrated implementations and applications, some of which are shown in the figures and characterized in the claims section that follows.

According to an example embodiment of the present invention, a light sensor arrangement includes two or more light sensors and an extraction circuit coupled to receive the signals from the sensors. The sensors include a first sensor that outputs a signal in response to light having a wavelength in a first range of wavelengths, and a second sensor that outputs a signal in response to light having a wavelength in a different range of wavelengths. The extraction circuit nonlinearly combines the signals from the sensors using the respective quantum efficiencies of each sensor to provide data that characterizes the luminous flux of the light.

According to another example embodiment of the present invention, an electronic display controller arrangement controls an electronic display in response to the presence of visible light. The arrangement includes a stacked photodiode sensor in a semiconductor substrate, an extraction circuit and an electronic display controller circuit. The stacked photodiode sensor includes an upper photodiode that filters ambient light and provides a signal in response to visible light in the ambient light, and a lower photodiode that is arranged below the upper photodiode to receive the filtered light and that provides a signal in response to infrared light in the filtered light. The extraction circuit is coupled to receive and nonlinearly numerically combine the signals from the photodiodes using the quantum efficiency of the photodiodes, and generates a luminous flux output that is indicative of predominantly visible light in the ambient light. The electronic display controller circuit receives and uses the luminous flux output to control the display of images on the electronic display.

According to another example embodiment of the present invention, an electronic display is controlled using detected ambient light. Light having a wavelength in a first range of wavelengths is detected and a signal is output in response thereto. Light having a wavelength in a different range of wavelengths is also detected, and another signal is output in response thereto. The signals are nonlinearly combined, using the respective quantum efficiencies of the detection, to provide data that characterizes the luminous flux of the light.

The above summary is not intended to describe each illustrated embodiment or every implementation of the present invention. The figures and detailed description that follow more particularly exemplify these embodiments.

The invention may be more completely understood in consideration of the following detailed description of various embodiments of the invention in connection with the accompanying drawings, in which.

Figure 1:
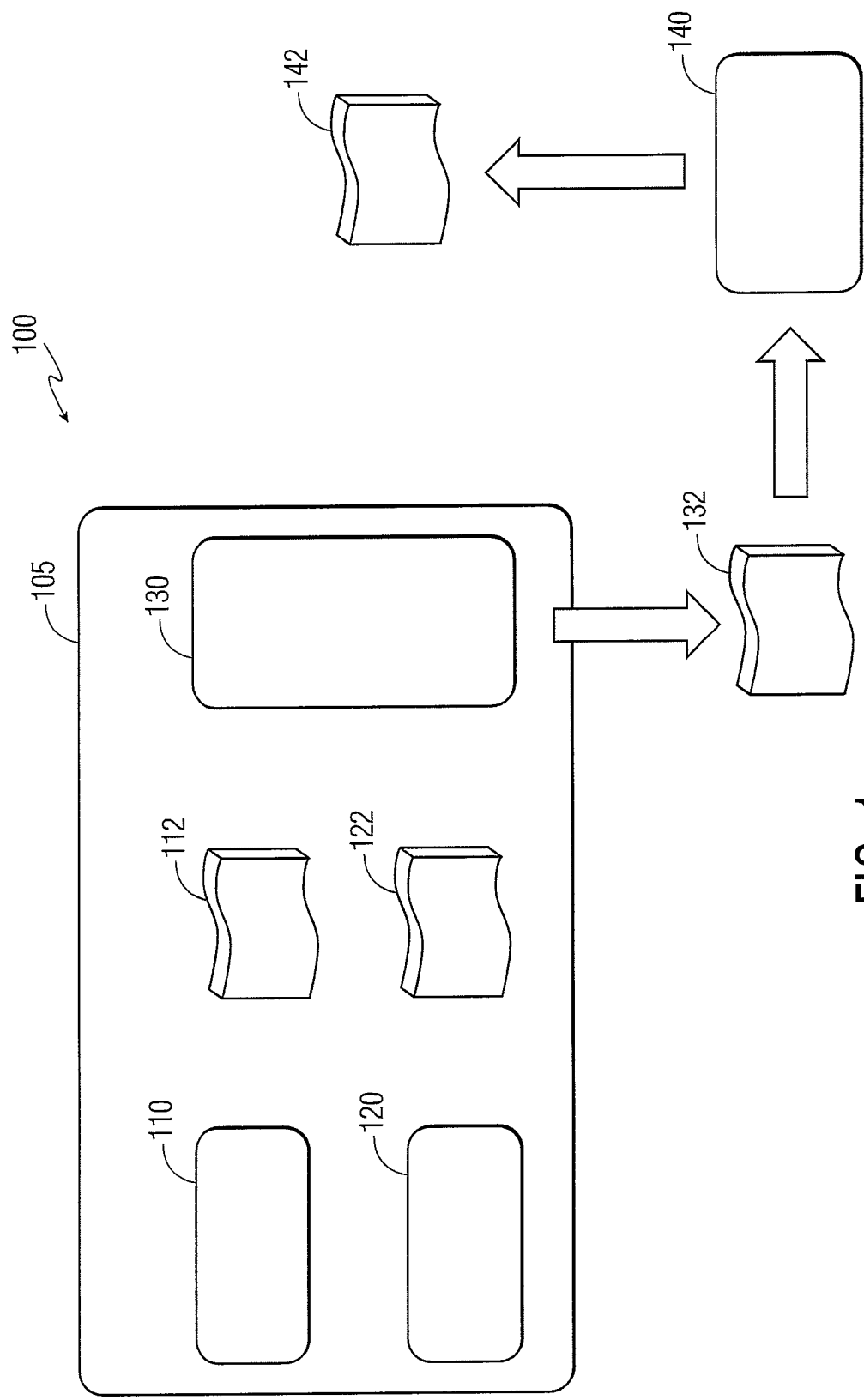
FIG. 1 shows a system for detecting visible light and controlling an electronic display device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention, including that defined by the appended claims.

The present invention is applicable to a variety of sensor arrangements and approaches, and particularly to sensor arrangements for selectively detecting visible light. While the present invention is not necessarily limited to such applications, an appreciation of various aspects of the invention is best gained through a discussion of examples in such an environment.

According to an example embodiment of the present invention, a semiconductor sensor arrangement provides an output signal that characterizes the visible (luminous) portion of ambient light, to control the intensity, color palette or other characteristics of an electronic display in a manner that facilitates human perception of the quality of displayed images. A sensor structure provides two or more outputs that characterize visible and non-visible characteristics of background radiation. An extraction circuit nonlinearly combines the outputs to extract the luminous content of background irradiance that extends beyond the visible range, and generates an output that is predominantly indicative of luminous flux in the background radiation.

In some embodiments, the sensors include a stacked semiconductor photodiode sensor arrangement with upper and lower sensors, the upper sensor being responsive to light in the visible spectrum and the lower sensor being responsive to light in the infrared (IR) spectrum. The stacked photodiodes are located in an epitaxial silicon substrate together with signal processing circuitry to receive and process outputs from the stacked photodiodes.

In some embodiments, the photodiodes employ wells having a majority carrier polarity that is common to the polarity of the substrate in which they are located. In one application, doped layers of p type epitaxial silicon are formed on a substrate having the same polarity to form p+ p− photodiode structures using, for example, two p-type implants in the photodiode area with a CMOS process, allowing straightforward implementation of the signal processing circuitry next to the photodiode. In another application, doped layers of n-type epitaxial silicon are formed on a substrate having the same polarity to similarly form n-type photodiode structures.

The term "light" as used in connection with many example embodiments refers generally to electromagnetic radiation, some of which generally includes light in the visible spectrum (i.e., as visible by the human eye) and non-visible light. In some contexts, non-visible light is referred to as radiation or electromagnetic radiation, and/or as synonymous with the term "light" while corresponding to radiation or light that is not in the visible spectrum. One example of light or radiation that is not in the visible spectrum is infrared light. In this regard, the term "light" is used in various contexts to apply not only to light in the visible spectrum, but to non-visible light (or radiation) such as infrared light (or infrared radiation).

FIG. 1 shows a system 100 for detecting visible light and controlling an electronic display device, according to another example embodiment of the present invention. The system includes sensors 110 and 120 that respectively detect light in different ranges of wavelengths, and that generate sensor data 112 and 122 in response to the detected light.

An extraction processor 130 nonlinearly processes the sensor data 112 and 122 to generate luminous flux output 132 that predominantly represents visible light incident upon the sensors (i.e., predominantly represents actual luminous flux). The luminous flux output 132 is sent to a display controller 140 that generates a control output 142 for operating an electronic display. In some embodiments, the control output 142 is used to operate relatively large displays such as those implemented with a computer, television or outdoor display such as those used at sporting events or in advertising. In other embodiments, the control output 142 is used to operate relatively small displays such as those implemented with handheld devices such as a mobile telephone, personal data assistant (PDA), digital media player or an imaging device.

In the above context and in connection with some embodiments, data from sensors 110 and 120, each of which represents light data that is beyond that relating to human eye response, is combined at the extraction processor 130 to generate an output that is a good representation of luminous flux. In some applications, the extraction processor 130 generates an output having a deviation relative to actual luminous flux at the sensors that is less then a few percent over a wide range of illumination conditions (e.g., incandescent, fluorescent and sunlight). In some particular implementations, at least about 95 percent of the detected visible light represented by the luminous flux output 132 corresponds to visible light, and in other embodiments, at least about 98 percent of the sensed visible light represented by the luminous flux output 132 corresponds to visible light. In this regard, the luminous flux output 132 is useful in quite accurately representing the amount of visible light (i.e., actual luminous flux) in the environment in which the sensors 110 and 120 are located, without undesirable representation of non-visible light such as that in the infrared spectrum.

For certain applications, the sensors 110 and 120 respectively detect light in particular ranges of wavelengths that suit different applications and that facilitate the generation of a luminous flux output 132 that is representative of the amount of visible light in the sensors' environment. In some embodiments, sensor 110 detects mainly visible light and sensor 120 detects mainly non-visible light (e.g., infrared light or other non-visible radiation). In these contexts, the term "mainly" generally refers to at least about 80%, for some applications, at least about 90% and, for some applications, about the amount of visible light detected by the human eye. The extraction processor 130 uses the sensor data together with the known amount of visible and non-visible light in each of the signals, and further with the known quantum efficiency of the sensors as appropriate, to generate the luminous flux output 132. In this context, the quantum efficiency of each sensor characterizes the sensor's sensitivity to light and, for certain applications, the sensor's sensitivity to light in one or more ranges of wavelengths.

As described above and as exemplified in FIG. 2, the sensors 110 and 120 may be implemented with semiconductor photodiodes and, further, are implemented together in a common semiconductor substrate with the extraction processor 130. This combination is represented by dashed lines showing a sensor arrangement 105, which may be a semiconductor chip having doped regions of common (or opposite) polarity forming the photodiodes (as sensors 110 and 120) and extraction processor 130. In certain embodiments, the display controller 140 is also implemented with the sensor arrangement 105 and, for certain applications, together with the extraction processor 130 in a common circuit bearing functionality relating both to the extraction and control functions respectively described with the extraction processor 130 and the display controller 140 above.

Figure 2:
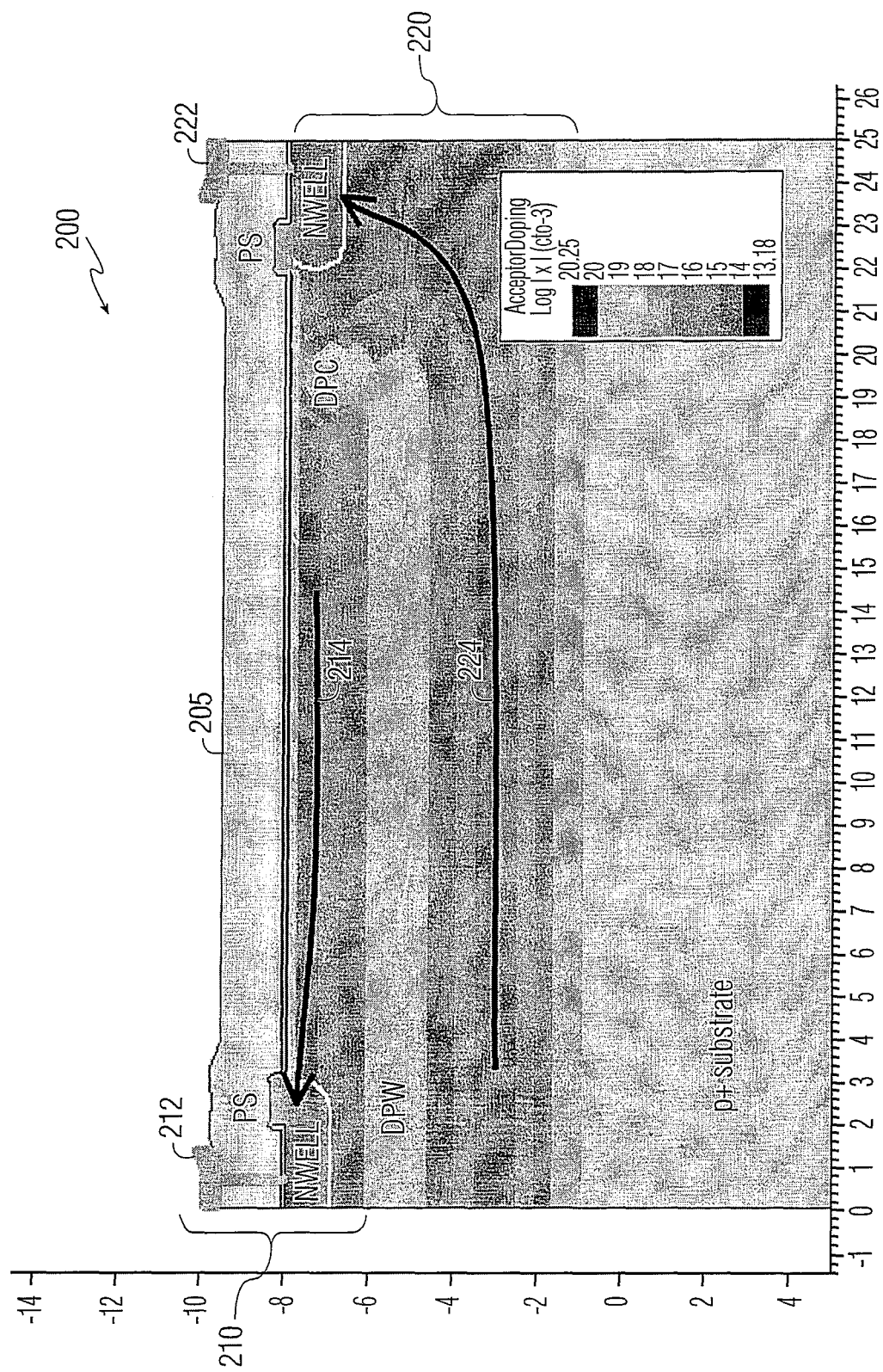
FIG. 2 shows a photodiode arrangement for sensing light, according to another example embodiment of the present invention.

As discussed above, a variety of light sensors and sensor approaches are implemented in connection with various embodiments, including those discussed in connection with FIG. 1. FIG. 2 shows a cross-sectional view of an example photodiode arrangement 200 for sensing ambient light, according to another example embodiment of the present invention. The sensor 200 is a CMOS-based semiconductor circuit that includes two diodes of which the top or upper photodiode 210 closest to the surface is electrically shielded from a deeper lying bottom or lower photodiode 220 by a buried p+ layer (DPW) and laterally by a p+ plug (DPC). In some applications, both cathodes (for each of photodiodes 210 and 220, and respectively at 212, 214) are implemented with a gated diode to reduce or minimize leakage current.

The top photodiode 210 is generally responsive to visible light and acts as a filter, passing mainly infrared light to the bottom photodiode 220, which is correspondingly mainly responsive to infrared light. The filtering effect of the top photodiode 210 can be tailored for certain applications, using silicon as the substrate in which the photodiode is formed with blue light penetrating silicon to a depth that is less than about 0.5 μm and red light penetrating several micrometers into the silicon. Infrared light has a deep penetration depth of more than about 10 μm, thus is detected with the bottom photodiode 220. In some applications, the top photodiode 210 is manufactured to respond mainly to light in the visible spectrum, and the bottom photodiode 220 is manufactured to respond mainly to light in the IR spectrum.

In this regard, various embodiments are directed to the positioning of the top photodiode 210 within about 2 μm of the upper surface to collect photo-generated charge between top surface and the 2 μm depth to detect light in the visible spectrum. The bottom photodiode is located deeper into the silicon substrate to collect photo-generated charge below the 2 μm depth of the top photodiode, facilitating the detection of light in the IR spectrum.

Outputs from the upper photodiode 210 and lower photodiode 220 are respectively passed to processing circuitry through top photodiode (PD) contact 212 and bottom photodiode (PD) contact 214. For instance, referring back to FIG. 1 by way of example, where implemented in such an arrangement, outputs (e.g., 112, 122) from the top and bottom PD contacts 212 and 222 are passed to processing circuitry (an extraction processor 130), where the outputs are nonlinearly combined to generate luminous flux data. In some contexts, this nonlinear combination involves a form of a subtraction of data obtained using the lower photodiode 220 from data obtained from the upper photodiode, with a nonlinear combination.

Referring again to FIG. 1, the nonlinear combination of sensor outputs at the extraction processor 130 is carried out in different manners, depending upon the nature of the sensors 110 and 120, the presence of additional sensors, and the desired or intended use of the luminous flux output 132. Where the sensors 110 and 120 are silicon-based sensors as relevant, for example, to the photodiode arrangement shown in FIG. 2, characteristics of the silicon are used to determine the nonlinear combination approach at the extraction processor 130. The probability that a photon is absorbed while traversing a slab of silicon at a depth from $y_{min}$ to $y_{max}$ is given by Equation 1:

$$P(y_{max}) = \int_{y_{min}}^{y_{max}} \alpha \cdot \exp(-\alpha \cdot y) dy, \quad (1)$$

where α is the photon absorption coefficient in silicon, which is a strong function of wavelength. The depth, in these contexts, can be exemplified as a depth below an upper surface 205 of the photodiode arrangement 200. In silicon, the absorption of 800 nm radiation is approximately an order of magnitude less than 500 nm radiation, such that infrared photons penetrate much deeper into silicon than photons of visible light. Varying the depth of the photosensitive area ($y_{min}$, $y_{max}$) of the photodiodes 210 and 220 (i.e., at arrows 214 and 224, respectively, showing current flow) affects the overall wavelength response. Using this information in Equation 1, or a related equation for semiconductor materials other than silicon as described, together with the depth of the photosensitive area of the photodiodes 210 and 220, the luminous content of the photodiode signals at 212 and 222 is extracted using a nonlinear combination. One approach to such a combination as may be implemented with the arrangements shown in FIG. 1 and in FIG. 2, as well as used together, is described in greater detail below in connection with Equation 2.

Figure 3:
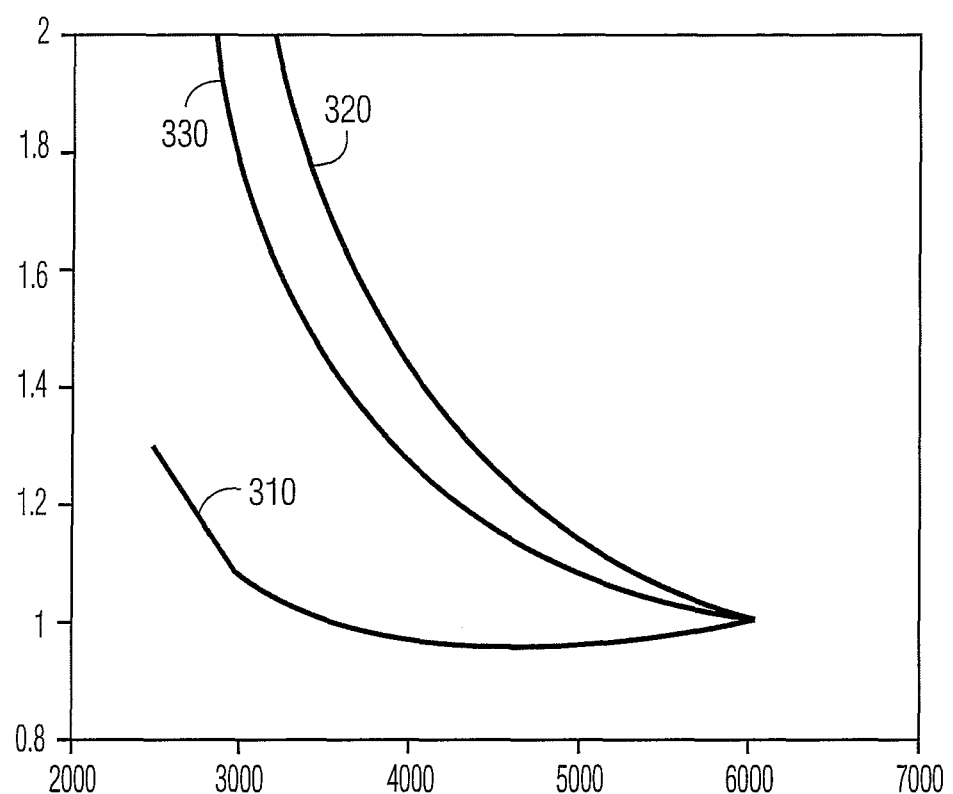
FIG. 3 shows plots of the respective responses of photodiodes in a stacked photodiode arrangement as implemented in connection with another example embodiment of the present invention.

FIG. 3 shows plots of the respective normalized response of stacked photodiodes per unit (Lux) of luminous content as a function of the color temperature of an emission source, in connection with another example embodiment of the present invention. Black body (color) temperature (in Kelvin) is shown in the horizontal axis (e.g., with the emission source assumed to be a black body) and the normalized response per Lux for the photodiodes is shown on the vertical axis. The response represented by this plot may be obtained and implemented using, for example, a stacked photodiode arrangement similar to that shown in FIG. 2 and described above, and generally exhibits an overestimation of the luminous content at low color temperatures.

Plot 310 shows the normalized response of an upper photodiode responsive mainly to light in the visible spectrum, and plot 320 shows the response of a lower photodiode responsive mainly to light in the infrared spectrum. Plot 330 shows the corresponding response of a single photodiode. Common color temperature ranges from 1850K (e.g., candle light), to 2800K (e.g., ordinary light bulbs) and up to 6000K for direct sunlight. As shown, neither a single diode as represented by plot 330, nor any of the two stacked diodes by itself (respectively represented by plots 310 and 320) provide a flat response (A/Lux) across the full color temperature range, as that the quantum efficiency (QE) of these devices does not match human eye response. As shown, moving down in color temperature shifts the emission toward infrared, which is invisible to the eye but still detected by the photodiodes, which results in an overestimation of the luminous level in ambient light, prior to correction and processing (e.g., as described herein).

As shown in plot 310, the stacked upper photodiode performs well, yet exhibits a small infrared tail still that induces an overestimation of the visible light content by as much as 30 percent at 2500K. In this regard, although the upper photodiode by itself can be tailored to exhibit a favorable infrared rejection (e.g., responds mainly to visible light), the remaining mismatch at low color temperatures is corrected by combining the information of the underlying bottom diode using a nonlinear approach.

Figure 4:
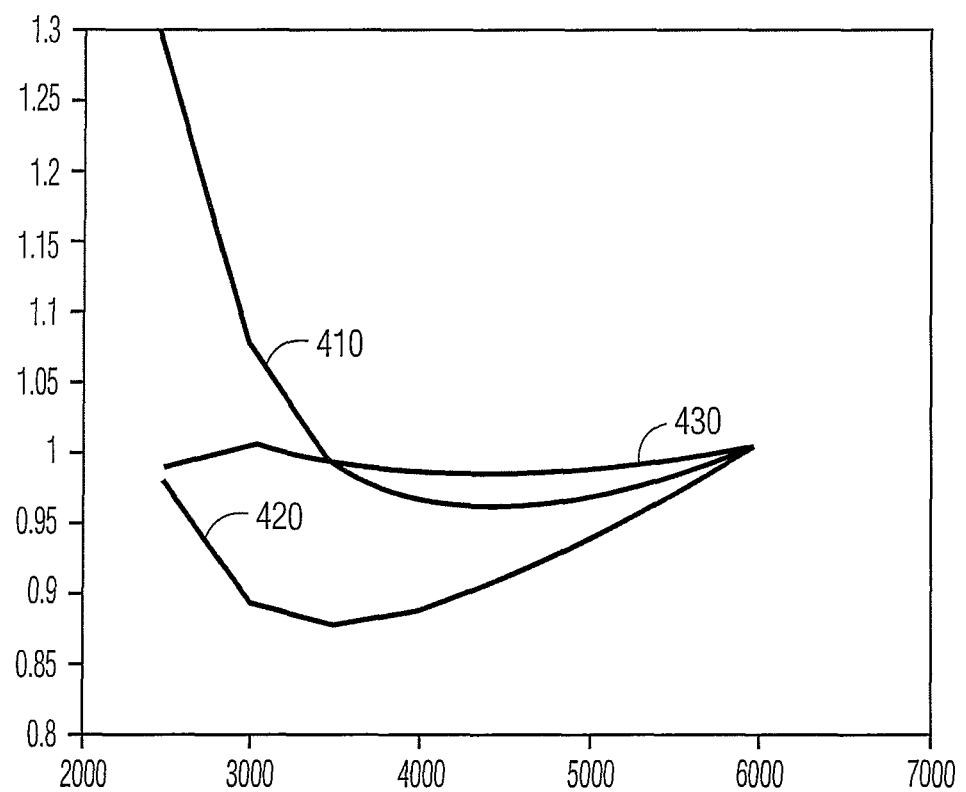
FIG. 4 shows plots of normalized responses from a pair of photodiodes obtained via nonlinear combination, in connection with another example embodiment of the present invention.

In this regard, the responses pertaining to plots 310 and 320 are nonlinearly processed to extract light data corresponding to detected infrared light and to provide an output that predominantly corresponds to visible light as perceptible by the human eye. FIG. 4, described below, further characterizes such a combination as applicable to use with photodiode responses relating to the plots as shown in FIG. 3.

FIG. 4 shows plots of the normalized response from a pair of photodiodes obtained via nonlinear combination, in connection with another example embodiment of the present invention. As with FIG. 3, black body (color) temperature (in Kelvin) is shown in the horizontal axis and the normalized response per Lux for the photodiodes is shown on the vertical axis. The response represented by this plot may also be obtained and implemented using, for example, a stacked photodiode arrangement similar to that shown in FIG. 2 and described above, and is further applicable to the normalization of the respective responses shown in FIG. 3.

Plot 410 shows the normalized and uncorrected response of a top photodiode (e.g., as relative to the above discussion with FIG. 2). Plots 420 and 430 show responses that are respectively based upon linear and second order combinations of the outputs of top and bottom photo-diodes. The second order correction approach represented in plot 430 facilitates the extraction of the luminous content within about ±1 percent over the full range. In this regard, an initial mismatch of about 30 percent at a color temperature of about 2500K in the uncorrected response as represented by plot 410 can be corrected to within a few percent to facilitate accurate detection of visible irradiance. These combination approaches may be implemented, for example, using an approach similar to that described in FIG. 1 with the extraction processor 130 generating an output that is a nonlinear combination of signals from upper and lower photodiodes as represented in plot 330.

A variety of approaches to nonlinearly combining sensor outputs are implemented in connection with different embodiments, depending upon the application, the arrangement and the composition of the photodiodes; some of these approaches involve the combination of outputs from two stacked photodiodes. Generally, these approaches involve a determination of luminous flux as a function of a non-linear combination of inputs from two (or more) photosensors. The following Equation 2 represents a particular example of such a determination using a non-linear combination (here, a second order correction) of stacked photodiode outputs:

$$\Phi = aI_{top}\left(1 + b\frac{I_{bot}}{I_{top}} + c\left(\frac{I_{bot}}{I_{top}}\right)^2\right) \quad (2)$$

where $I_{bot}$, $I_{top}$ are photocurrents of bottom and top photodiodes, a, b and c are interpolation coefficients and $\Phi$ is luminous flux. The interpolation coefficients are determined, for example, from calibrated luminous fluxes and/or using measured luminous irradiation and retrieved experimentally and facilitating the determination of a luminous flux $\Phi$ that follows eye responsivity variation from photopic (day light) to scotopic (night) vision via reiterations.

Equation 3 represents another approach to combining outputs from upper and lower photodiodes using a non-linear combination:

$$\Phi = I_{top} * f\left(\frac{I_{bot}}{I_{top}}\right) \quad (3)$$

where $f$ is a non-linear function of the ratio of both variables. Other related approaches to non-linearly combining sensor data involve defining luminous flux ($\Phi$) as $I_{top}$ multiplied by a tabulated function depending on $I_{bot}/I_{top}$.

These approaches to non-linear combination are applicable for use in connection with the generation of an output corresponding to the plot 430. For example, in certain embodiments, the extraction processor 130 in FIG. 1 uses Equation 2 to combine outputs from the sensors 110 and 120, which are respectively implemented with upper and lower photodiode as described above.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For example, other photodiode arrangements, such as those involving side-by-side arrangements as shown in U.S. Pat. No. 6,787,757 or a stacked structure as shown in U.S. Pat. No. 6,632,701 may be implemented with a nonlinear combination approach as described herein, and is fully incorporated herein by reference. Other modifications involve the use of different types of photodiodes with common and/or opposite doping, relative to a substrate in which they are formed and, for example, as described in U.S. Pat. No. 4,238,760, which is fully incorporated herein by reference. Such modifications and changes do not depart from the true scope of the present invention.

What is claimed is:

1. A light sensor arrangement comprising:
   a first sensor to output a signal in response to light having a wavelength in a first range of wavelengths;
   a second sensor to output a signal in response to light having a wavelength in a different range of wavelengths; and
   an extraction circuit, configured and arranged to receive the sensor signals, and determine luminous flux as a function of a nonlinear combination of the signals using respective quantum efficiencies of each sensor to provide data that characterizes luminous flux of the light, the nonlinear combination including a ratio of the signals;
   wherein the extraction circuit nonlinearly combines the signals using a second order combination.

2. The arrangement of claim 1, wherein the sensors are photodiodes located in a doped semiconductor substrate, each photodiode including a doped region of the same polarity as the doped semiconductor substrate, and each photodiode being configured and arranged to output a signal exclusively in response to light within a light range that is different than a light range to which the other one of the photodiodes is configured and arranged to exclusively respond to, and the nonlinear combination includes a second order nonlinear combination.

3. The arrangement of claim 1, wherein the sensors and the extraction circuit are located in a commonly-doped semiconductor substrate, the sensors are vertically stacked in a substrate with the second sensor below the first sensor, and the nonlinear combination includes an output signal of the first sensor multiplied by a ratio of the signals.

4. The arrangement of claim 1, wherein the sensors are located in a doped semiconductor substrate and include a doped semiconductor material having a polarity that is opposite to a polarity of the doped semiconductor substrate.

5. The arrangement of claim 1, wherein the sensors are vertically stacked in a substrate with the second sensor below the first sensor.

6. The arrangement of claim 1, wherein the first sensor generates a response that is predominantly indicative of visible light and the second sensor generates a response that is predominantly indicative of non-visible light.

7. The arrangement of claim 1, wherein the first sensor filters light passed to the second sensor, the filtered light reaching the second sensor being mainly infrared light.

8. The arrangement of claim 1, wherein at least one of the sensors includes a semiconductor substrate doped with p+ and p− dopants that form the sensor arrangement.

9. An electronic display controller arrangement for controlling an electronic display in response to the presence of visible light, the arrangement comprising:
   a stacked photodiode sensor in a semiconductor substrate and including an upper photodiode that filters ambient light and provides a signal in response to visible light in the ambient light,
a lower photodiode that is arranged below the upper photodiode to receive the filtered light and that provides a signal in response to infrared light in the filtered light;
an extraction circuit coupled to receive and determine luminous flux as a function of a nonlinear combination of the signals from the photodiodes using the quantum efficiency of the photodiodes, and to generate a luminous flux output, based on the determined luminous flux, that is indicative of predominantly visible light in the ambient light, the nonlinear combination including a ratio of the signals; and
an electronic display controller circuit to receive and use the luminous flux output to control the display of images on the electronic display;
wherein the extraction circuit nonlinearly numerically combines the signals from the photodiodes using the quantum efficiency of the photodiodes by determining interpolation coefficients from calibrated luminous fluxes.

10. The arrangement of claim 9, wherein the extraction circuit is located in the semiconductor substrate, and the nonlinear combination includes a second order nonlinear combination.

11. The arrangement of claim 9, further including a doped region of the substrate that electrically shields the upper and lower photodiodes from one another.

12. The arrangement of claim 9, further including, for each photodiode, a low-leakage cathode contacting the photodiode via a collector gate that facilitates operation of the photodiode at a bias of about zero.

13. The arrangement of claim 9, wherein the extraction circuit nonlinearly numerically combines the signals from the photodiodes using the quantum efficiency of the photodiodes by determining interpolation coefficients as a function of measured luminous irradiation to generate a luminous flux output that reflects eye responsivity variation from photopic to scotopic conditions.

14. A method for controlling an electronic display, the method comprising:
detecting light having a wavelength in a first range of wavelengths and outputting a signal in response thereto;
detecting light having a wavelength in a different range of wavelengths and outputting a signal in response thereto; and
using a nonlinear combination of the signals, including a ratio of the signals, and respective quantum efficiencies of sensors used to detect the light to provide data that characterizes luminous flux of the light;
further including determining interpolation coefficients from calibrated luminous fluxes, wherein using a nonlinear combination of the signals and respective quantum efficiencies of the sensors to provide data includes using the determined interpolation coefficients.

15. The method of claim 14, wherein
detecting light having a wavelength in a first range of wavelengths and outputting a signal in response thereto includes outputting a signal that is predominantly indicative of visible light,
detecting light having a wavelength in a different range of wavelengths and outputting a signal in response thereto includes outputting a signal that is predominantly indicative of non-visible light, and
using a nonlinear combination of the signals includes using a second order nonlinear combination.

16. The method of claim 14, wherein detecting light having a wavelength in a first range of wavelengths includes using a first sensor, and wherein detecting light having a wavelength in a different range of wavelengths includes using a second sensor, further including using the first sensor to filter light passed to the second sensor.

17. The method of claim 14, further including using a doped portion of a semiconductor substrate to electrically shield the sensors used to detect the light.

* * * * *